United States Patent
Lee et al.

(10) Patent No.: US 9,831,074 B2
(45) Date of Patent: Nov. 28, 2017

(54) BIPOLAR COLLIMATOR UTILIZED IN A PHYSICAL VAPOR DEPOSITION CHAMBER

(71) Applicant: Applied Materials, Inc., Santa Clara, CA (US)

(72) Inventors: Joung Joo Lee, San Jose, CA (US); Guojun Liu, San Jose, CA (US); Wei W. Wang, Santa Clara, CA (US); Prashanth Kothnur, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1 day.

(21) Appl. No.: 14/062,627

(22) Filed: Oct. 24, 2013

(65) Prior Publication Data
US 2015/0114823 A1    Apr. 30, 2015

(51) Int. Cl.
| | | |
|---|---|---|
| H01J 37/34 | (2006.01) | |
| C23C 14/22 | (2006.01) | |
| C23C 14/04 | (2006.01) | |
| C23C 14/34 | (2006.01) | |

(52) U.S. Cl.
CPC ........ *H01J 37/3447* (2013.01); *C23C 14/042* (2013.01); *C23C 14/3471* (2013.01); *C23C 14/22* (2013.01); *H01J 37/3426* (2013.01)

(58) Field of Classification Search
CPC ..... H01J 37/34; H01J 37/3447; C23C 14/046; C23C 14/35; C23C 14/04; C23C 14/042; C23C 14/044; C23C 14/3471; C23C 14/22
See application file for complete search history.

(56) References Cited

U.S. PATENT DOCUMENTS

| | | | | |
|---|---|---|---|---|
| 5,728,276 | A * | 3/1998 | Katsuki | C23C 14/34 204/192.12 |
| 6,168,832 | B1 * | 1/2001 | Boucher | C23C 14/044 204/192.1 |
| 6,562,200 | B2 * | 5/2003 | Iwase et al. | 204/192.12 |
| 7,527,713 | B2 * | 5/2009 | Gung et al. | 204/192.12 |
| 2009/0308739 | A1 | 12/2009 | Riker et al. | |
| 2010/0096253 | A1 | 4/2010 | Cao et al. | |

(Continued)

FOREIGN PATENT DOCUMENTS

| | | |
|---|---|---|
| JP | 10-88337 A | 4/1988 |
| JP | 07-074103 | 3/1995 |
| JP | 8-203828 A | 8/1996 |

(Continued)

OTHER PUBLICATIONS

PCT International Search Report and Written Opinion of, PCT/US2014/053164, dated Dec. 11, 2014. The PCT Search Report is being used as the English translation for foreign reference, JP 10-88337, JP 8-203828, and JP 7-74103.

(Continued)

*Primary Examiner* — Michael Band
(74) *Attorney, Agent, or Firm* — Patterson + Sheridan, LLP

(57) ABSTRACT

The present invention provides an apparatus including a bipolar collimator disposed in a physical vapor deposition chamber and methods of using the same. In one embodiment, an apparatus includes a chamber body and a chamber lid disposed on the chamber body defining a processing region therein, a collimator disposed in the processing region, and a power source coupled to the collimator.

17 Claims, 5 Drawing Sheets

(56) References Cited

U.S. PATENT DOCUMENTS

2011/0248633 A1 10/2011 Nauman et al.
2012/0264291 A1 10/2012 Ganguli et al.

FOREIGN PATENT DOCUMENTS

JP     2007273490 A  * 10/2007
JP     2011-023649 A    2/2011

OTHER PUBLICATIONS

Chen-Yao Liu, et al., "Design and Implementation a Switching Mode Bipolar Power Stage of the Correction Power Supply", Proceeding of EPAC 2004.
Weerasak Somkhunthot, et al., "Bipolar Pulsed-DC Power Supply for Magnetron Sputtering and Thin Films Synthesis", 2007.

* cited by examiner

BIPOLAR COLLIMATOR UTILIZED IN A PHYSICAL VAPOR DEPOSITION CHAMBER

BACKGROUND OF THE DISCLOSURE

Field of the Invention

Embodiments of the invention generally relate to a collimator utilized in a physical vapor deposition chamber for forming a metal containing layer on a substrate, and more particularly, a bipolar collimator utilized in a physical vapor deposition chamber for forming a metal containing layer on a substrate in a semiconductor manufacturing process.

Description of the Background Art

Reliably producing submicron and smaller features is one of the key technologies for the next generation of very large scale integration (VLSI) and ultra large scale integration (ULSI) of semiconductor devices. However, as the miniaturization of circuit technology is pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase for next generation devices, the widths of interconnects, such as vias, trenches, contacts, gate structures and other features, as well as the dielectric materials therebetween, decrease to 45 nm and 32 nm dimensions, whereas the thickness of the dielectric layers remain substantially constant, with the result of increasing the aspect ratios of the features.

Sputtering, also known as physical vapor deposition (PVD), is an important method of forming metallic features in integrated circuits. Sputtering deposits a material layer on a substrate. A source material, such as a target, is bombarded by ions strongly accelerated by an electric field. The bombardment ejects material from the target, and the material then deposits on the substrate.

Physical vapor deposition process has more recently been adapted to deposit material in trenches and vias with high aspect ratios formed on substrates. A dielectric layer is generally formed over a conductive layer or feature and patterned to expose the conductive feature at the bottom of a via or trench. A barrier layer is generally deposited to prevent interdiffusion between layers, and then metal is sputtered into the trench.

In a physical vapor deposition process, fast-moving ions barrel into the target, dislodging particles from the target surface. The particles may be charged by the interaction with the incident ions through a charge transfer mechanism. Alternatively, the particles may be charged through interaction with any electric fields existing in the space, or the particles may remain uncharged. Deposition generally occurs faster on field regions and near the tops of trench sidewalls. During deposition, ejected particles may travel in all directions, rather than travelling in directions generally orthogonal to the substrate surface, thereby resulting in overhanging structures formed on the corners of the trench before penetrating deeply into the trench. Overhang may result in metal plugs with holes or voids formed therein. For example, overhang portions on opposite sides of a trench may grow together, resulting in premature closing and thus preventing complete filling of the trench and forming a hole or a void. Such holes are not conductive, and severely diminish the electrical conductivity of the formed feature.

As devices formed on semiconductor substrates grow smaller and smaller, aspect ratio, the ratio of height to width, of trenches and vias formed in substrate layers grows larger. Higher aspect ratio geometries has higher degree of difficulty to fill without voids.

Conventionally, controlling the ion fractions or ion density reaching to the substrate surface at a desired range may improve the bottom and sidewall coverage during the metal layer deposition process. In one example, the particles dislodged from the target may be ionized and accelerated under an electrical bias applied to the substrate so as to encourage particles to travel down into the trench before early closing-up of the trench. It is believed that by controlling the ion fraction/ion density reached onto the substrate surface may efficient promote ion trajectory reaching down to the bottom of the trench. The accelerated ions may travel more uniformly in a direction orthogonal to the surface of the substrate. As accelerated ions approach the substrate surface, momentum carried from the accelerated ions may reach deep down into the trench, whereupon they deflect toward the trench sidewall under the influence of the electrical bias. Nonetheless, the deeper penetration into the trench reduces the effect of overhang near the top of the sidewall. However, as the aspect ratio of the trenches is getting higher and the substrate size is becoming larger, it has become more difficult to control the ion fraction/ion density reaching down to the trench bottom and also more difficult to uniformly distributions across the substrate surface. Thus, physical vapor deposition process remains a challenge to overcome the increasingly vexing problem of overhang management.

Therefore, there is a need for an improved method and apparatus for forming a metal containing layer with good bottom and sidewall management.

SUMMARY OF THE INVENTION

The present invention provides an apparatus including a bipolar collimator disposed in a physical vapor deposition chamber and methods of using the same. In one embodiment, an apparatus includes a chamber body and a chamber lid disposed on the chamber body defining a processing region therein, a collimator disposed in the processing region, and a power source coupled to the collimator.

In another embodiment, an apparatus includes a chamber body and a chamber lid disposed on the chamber body defining a processing region therein, a target disposed under the chamber lid, a collimator disposed in the processing region under the lid, and a power source coupled to the collimator.

In yet another embodiment, a method of sputter depositing a metal containing etching stop layer on the substrate includes transferring a substrate in a processing chamber, supplying a gas mixture into the processing chamber, applying a RF source power to form a plasma from the gas mixture to sputter source material from a target disposed in the processing chamber, applying a DC bias power to a collimator disposed in the processing chamber, and depositing a metal layer onto the substrate from the sputtered source material.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides an apparatus having a bipolar collimator disposed in a physical vapor deposition chamber that may utilize to accelerate ions with different directionality passing therethrough. In one embodiment, a bipolar DC bias power source may be coupled to a collimator disposed in the physical vapor deposition chamber to efficiently control ion/neutral filtering effect so as to efficiently control ion trajectory behavior and assist the bottom-up filling capability during the physical vapor deposition process.

Figure 1:
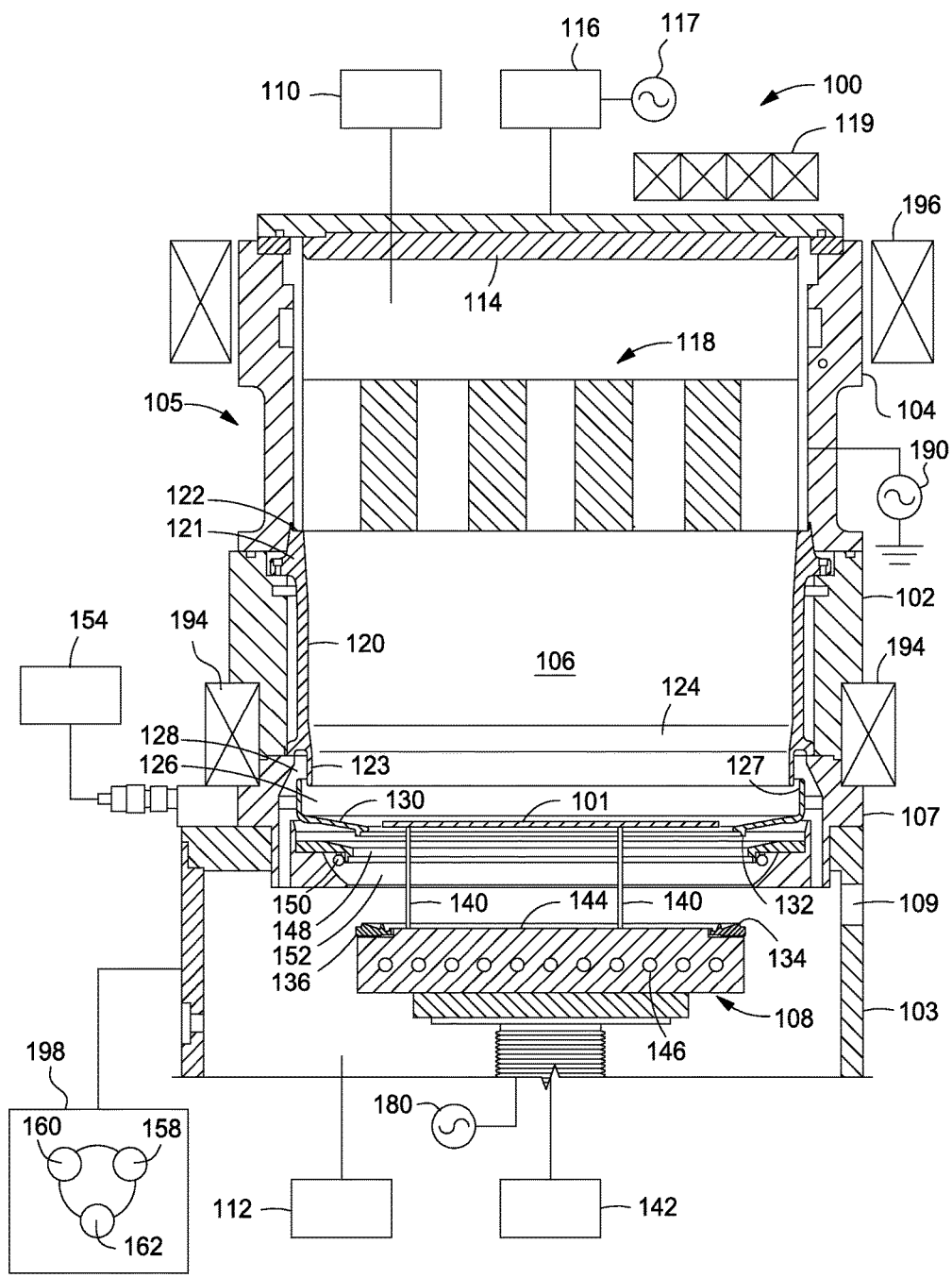
FIG. 1 depicts a schematic cross-sectional view of one embodiment of a process chamber in accordance with the invention.

FIG. 1 illustrates a physical vapor deposition (PVD) chamber 100 (e.g., a sputter process chamber) having a bipolar collimator 118 disposed therein suitable for sputter depositing materials according to one embodiment of the invention. Examples of PVD chambers which may be adapted to benefit from the invention include the ALPS® Plus and SIP ENCORE® PVD processing chambers, both commercially available from Applied Materials, Inc., Santa Clara, of california. It is contemplated that processing chambers available from other manufactures may also be adapted to perform the embodiments described herein.

The deposition chamber 100 has an upper sidewall 102, a lower sidewall 103, and a lid portion 104 defining a body 105 that encloses an interior volume 106 thereof. An adapter plate 107 may be disposed between the upper sidewall 102 and the lower sidewall 103. A substrate support, such as a pedestal 108, is disposed in the interior volume 106 of the deposition chamber 100. A substrate transfer port 109 is formed in the lower sidewall 103 for transferring substrates into and out of the interior volume 106.

In one embodiment, the deposition chamber 100 comprises a sputtering chamber, also known as a physical vapor deposition (PVD) chamber, capable of depositing, for example, titanium, aluminum oxide, aluminum, aluminum oxynitride, copper, tantalum, tantalum nitride, tantalum oxynitride, titanium oxynitride, tungsten, or tungsten nitride on a substrate, such as the substrate 101.

A gas source 110 is coupled to the deposition chamber 100 to supply process gases into the interior volume 106. In one embodiment, process gases may include inert gases, non-reactive gases, and reactive gases if necessary. Examples of process gases that may be provided by the gas source 110 include, but not limited to, argon gas (Ar), helium (He), neon gas (Ne), nitrogen gas ($N_2$), oxygen gas ($O_2$), and $H_2O$ among others.

A pumping device 112 is coupled to the deposition chamber 100 in communication with the interior volume 106 to control the pressure of the interior volume 106. In one embodiment, the pressure level of the deposition chamber 100 may be maintained at about 1 Torr or less. In another embodiment, the pressure level of the deposition chamber 100 may be maintained at about 500 milliTorr or less. In yet another embodiment, the pressure level of the deposition chamber 100 may be maintained at about 1 milliTorr and about 300 milliTorr.

The lid portion 104 may support a sputtering source 114, such as a target. In one embodiment, the sputtering source 114 may be fabricated from a material containing titanium (Ti) metal, tantalum metal (Ta), tungsten (W) metal, cobalt (Co), nickel (Ni), copper (Cu), aluminum (Al), alloys thereof, combinations thereof, or the like. In an exemplary embodiment depicted herein, the sputtering source 114 may be fabricated by titanium (Ti) metal, tantalum metal (Ta) or aluminum (Al).

The sputtering source 114 may be coupled to a source assembly 116 comprising a power supply 117 for the sputtering source 114. A magnetron assembly 119 which includes set of magnets may be coupled adjacent to the sputtering source 114 which enhances efficient sputtering materials from the sputtering source 114 during processing. Examples of the magnetron assembly include an electro-magnetic linear magnetron, a serpentine magnetron, a spiral magnetron, a double-digitated magnetron, a rectangularized spiral magnetron, among others.

In one embodiment, a first set of magnets 194 may be disposed between the adapter plate 107 and the upper sidewall 102 to assist generating electronic field to the metallic ions dislodged from the sputtering source 114. Furthermore, a second set of magnets 196 may be disposed adjacent to the lid portion 104 to assist generating an electrode field to dislodge materials from the sputtering source 114. It is noted that the numbers of the magnets disposed around the deposition chamber 100 may be as many as needed to improve plasma dissociation and sputtering efficiency.

An additional RF power source 180 may also coupled to the deposition chamber 100 through the pedestal 108 to provide a bias power between the sputtering source 114 and the pedestal 108 as needed. In one embodiment, the RF power source 180 may have a frequency between about 400 Hz and about 60 MHz, such as about 13.56 MHz.

A collimator 118 may be positioned in the interior volume 106 between the sputtering source 114 and the pedestal 108. The collimator 118 may be in bipolar mode so as to control direction of the ions passing therethrough. A controllable direct current (DC) or AC collimator power source 190 may be coupled to the collimator 118 to provide an alternating pulsed positive or negative voltage to the collimator 118 so as to control the collimator 118 in a bipolar mode. Details regarding the bipolar mode collimator 118 will be further discussed below with referenced to FIGS. 2-3. In one embodiment depicted herein, the power source 190 is a DC power source.

A shield tube 120 may be in proximity to the collimator 118 and interior of the lid portion 104. The collimator 118 includes a plurality of apertures to direct gas and/or material flux within the interior volume 106. The collimator 118 may be mechanically and electrically coupled to the shield tube 120. In one embodiment, the collimator 118 is mechanically coupled to the shield tube 120, such as by a welding process, making the collimator 118 integral to the shield tube 120. In another embodiment, the collimator 118 may be electrically floating within the chamber 100. In another embodiment, the collimator 118 may be coupled to an electrical power source and/or electrically coupled to the lid portion 104 of the body 105 of the deposition chamber 100.

The shield tube 120 may include a tubular body 121 having a recess 122 formed in an upper surface thereof. The recess 122 provides a mating interface with a lower surface of the collimator 118. The tubular body 121 of the shield tube 120 may include a shoulder region 123 having an inner diameter that is less than the inner diameter of the remainder of the tubular body 121. In one embodiment, the inner surface of the tubular body 121 transitions radially inward along a tapered surface 124 to an inner surface of the shoulder region 123. A shield ring 126 may be disposed in the chamber 100 adjacent to the shield tube 120 and intermediate of the shield tube 120 and the adapter plate 107. The shield ring 126 may be at least partially disposed in a recess 128 formed by an opposing side of the shoulder region 123 of the shield tube 120 and an interior sidewall of the adapter plate 107.

In one aspect, the shield ring 126 includes an axially projecting annular sidewall 127 that includes an inner diameter that is greater than an outer diameter of the shoulder region 123 of the shield tube 120. A radial flange 130 extends from the annular sidewall 127. The radial flange 130 may be formed at an angle greater than about ninety degrees (90°) relative to the inside diameter surface of the annular sidewall 127 of the shield ring 126. The radial flange 130 includes a protrusion 132 formed on a lower surface thereof. The protrusion 132 may be a circular ridge extending from the surface of the radial flange 130 in an orientation that is substantially parallel to the inside diameter surface of the annular sidewall 127 of the shield ring 126. The protrusion 132 is generally adapted to mate with a recessed flange 134 formed in an edge ring 136 disposed on the pedestal 108. The recessed flange 134 may be a circular groove formed in the edge ring 136. The engagement of the protrusion 132 and the recessed flange 134 centers the shield ring 126 with respect to the longitudinal axis of the pedestal 108. The substrate 101 (shown supported on lift pins 140) is centered relative to the longitudinal axis of the pedestal 108 by coordinated positioning calibration between the pedestal 108 and a robot blade (not shown). In this manner, the substrate 101 may be centered within the deposition chamber 100 and the shield ring 126 may be centered radially about the substrate 101 during processing.

In operation, a robot blade (not shown) having the substrate 101 thereon is extended through the substrate transfer port 109. The pedestal 108 may be lowered to allow the substrate 101 to be transferred to the lift pins 140 extending from the pedestal 108. Lifting and lowering of the pedestal 108 and/or the lift pins 140 may be controlled by a drive 142 coupled to the pedestal 108. The substrate 101 may be lowered onto a substrate receiving surface 144 of the pedestal 108. With the substrate 101 positioned on the substrate receiving surface 144 of the pedestal 108, sputter deposition may be performed on the substrate 101. The edge ring 136 may be electrically insulated from the substrate 101 during processing. Therefore, the substrate receiving surface 144 may include a height that is greater than a height of portions of the edge ring 136 adjacent the substrate 101 such that the substrate 101 is prevented from contacting the edge ring 136. During sputter deposition, the temperature of the substrate 101 may be controlled by utilizing thermal control channels 146 disposed in the pedestal 208.

After sputter deposition, the substrate 101 may be elevated utilizing the lift pins 140 to a position that is spaced away from the pedestal 108. The elevated location may be proximate one or both of the shield ring 126 and a reflector ring 148 adjacent to the adapter plate 107. The adapter plate 107 includes one or more lamps 150 coupled thereto intermediate of a lower surface of the reflector ring 148 and a concave surface 152 of the adapter plate 107. The lamps 150 provide optical and/or radiant energy in the visible or near visible wavelengths, such as in the infra-red (IR) and/or ultraviolet (UV) spectrum. The energy from the lamps 150 is focused radially inward toward the backside (i.e., lower surface) of the substrate 101 to heat the substrate 101 and the material deposited thereon. Reflective surfaces on the chamber components surrounding the substrate 101 serve to focus the energy toward the backside of the substrate 101 and away from other chamber components where the energy would be lost and/or not utilized. The adapter plate 107 may be coupled to a coolant source 154 to control the temperature of the adapter plate 207 during heating.

After controlling the substrate 101 to the desired temperature, the substrate 101 is lowered to a position on the substrate receiving surface 144 of the pedestal 108. The substrate 101 may be rapidly cooled utilizing the thermal control channels 146 in the pedestal 108 via conduction. The temperature of the substrate 101 may be ramped down from the first temperature to a second temperature in a matter of seconds to about a minute. The substrate 101 may be removed from the deposition chamber 100 through the substrate transfer port 109 for further processing. The substrate 101 may be maintained at a desired temperature range, such as less than 250 degrees Celsius as needed.

A controller 198 is coupled to the deposition chamber 100. The controller 198 includes a central processing unit (CPU) 160, a memory 158, and support circuits 162. The controller 198 is utilized to control the process sequence, regulating the gas flows from the gas source 110 into the deposition chamber 100 and controlling ion bombardment of the sputtering source 114. The CPU 160 may be of any form of a general purpose computer processor that can be used in an industrial setting. The software routines can be stored in the memory 158, such as random access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU into a specific purpose computer (controller) 198 that controls the deposition chamber 100 such that the processes are performed in accordance with the present invention. The software routines may also be stored and/or executed by a second controller (not shown) that is located remotely from the chamber 100.

During processing, material is sputtered from the sputtering source 114 and deposited on the surface of the substrate 101. The sputtering source 114 and the substrate support pedestal 108 are biased relative to each other by the power supply 117 or 180 to maintain a plasma formed from the process gases supplied by the gas source 110. The DC pulsed bias power applied to the collimator 118 also assist controlling ratio of the ions and neutrals passing through the collimator 118, thereby enhancing the trench sidewall and bottom fill-up capability. The ions from the plasma are accelerated toward and strike the sputtering source 114, causing target material to be dislodged from the sputtering source 114. The dislodged target material and process gases forms a layer on the substrate 101 with desired compositions.

Figure 2:
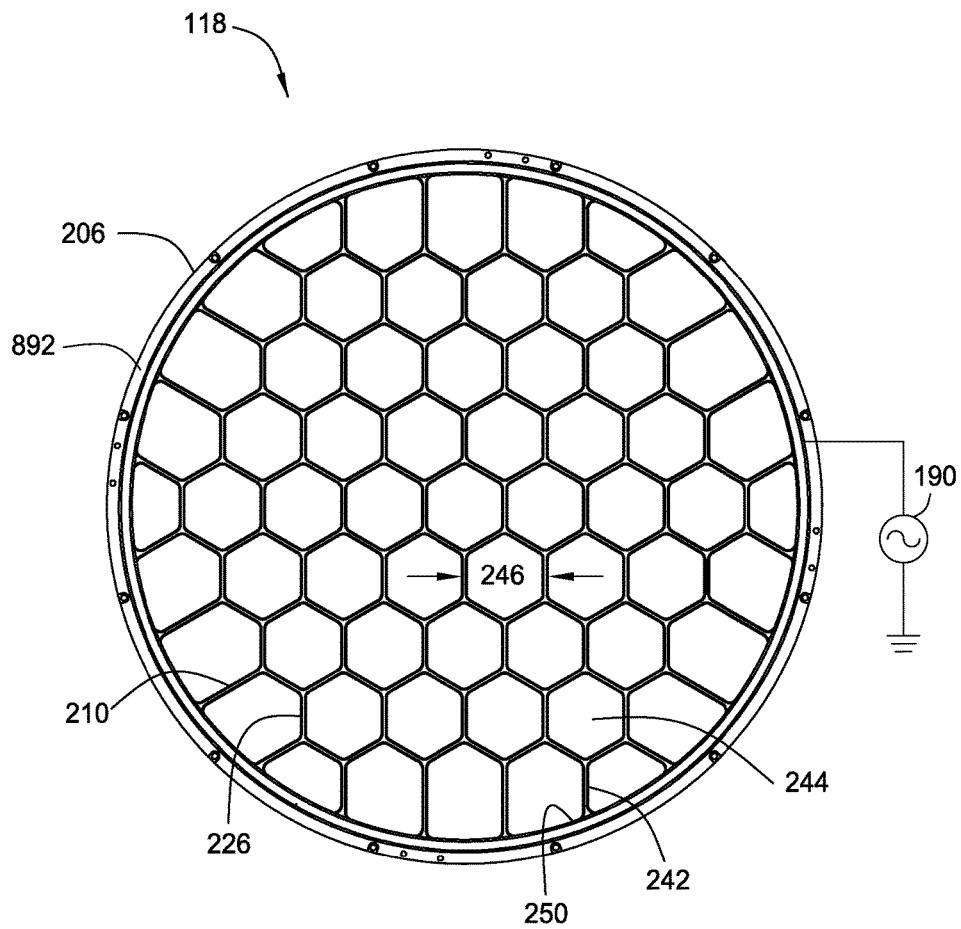
FIG. 2 depicts a top view of one embodiment of a bipolar collimator in accordance with one embodiment of the present invention.

FIG. 2 depicts a top view of the collimator 118 coupled to the Collimator power source 190 that may be disposed in the deposition chamber 100 of FIG. 1. The collimator 118 is generally a honeycomb structure having hexagonal walls 226 separating hexagonal apertures 244 in a close-packed arrangement. An aspect ratio of the hexagonal apertures 244 may be defined as the depth of the aperture 244 (equal to the length of the collimator) divided by the width 246 of the aperture 244. In one embodiment, the thickness of the walls 226 is between about 0.06 inches and about 0.18 inches. In one embodiment, the thickness of the walls 226 is between about 0.12 inches and about 0.15 inches. In one embodiment, the collimator 118 is comprised of a material selected from aluminum, copper, and stainless steel.

The honeycomb structure of the collimator 118 may serve as an integrated flux optimizer 210 to optimize the flow path, ion fraction and ion trajectory behavior of ions passing through the collimator 118. In one embodiment, the hexagonal walls 226 adjacent to a shield portion 892 have a chamfer 250 and a radius. The shield portion 892 of the collimator 118 may assist installing the collimator 118 into the deposition chamber 100.

In one embodiment, the collimator 118 may be machined from a single mass of aluminum. The collimator 118 may optionally be coated or anodized. Alternatively, the collimator 118 may be made from other materials compatible with the processing environment, and may also be comprised of one or more sections. Alternatively, the shield portion 892 and the integrated flux optimizer 210 are formed as separate pieces and coupled together using suitable attachment means, such as welding.

The collimator 118 functions as a filter to trap ions and neutrals that are emitted from the material from the sputtering source 114 at angles exceeding a selected angle, near normal relative to the substrate 101. The collimator 118 may have an aspect ratio change across the width of the collimator 118 as needed to allow different percentage of ions emitted from a center or a peripheral region of the material from the sputtering source 114 to pass through the collimator 118. As a result, both the number of ions and the angle of arrival of ions deposited onto peripheral regions and center regions of the substrate 101 are adjusted and controlled. Therefore, material may be more uniformly sputter deposited across the surface of the substrate 101. Additionally, material may be more uniformly deposited on the bottom and sidewalls of high aspect ratio features, particularly high aspect ratio vias and trenches located near the periphery of the substrate 101.

Figure 4:
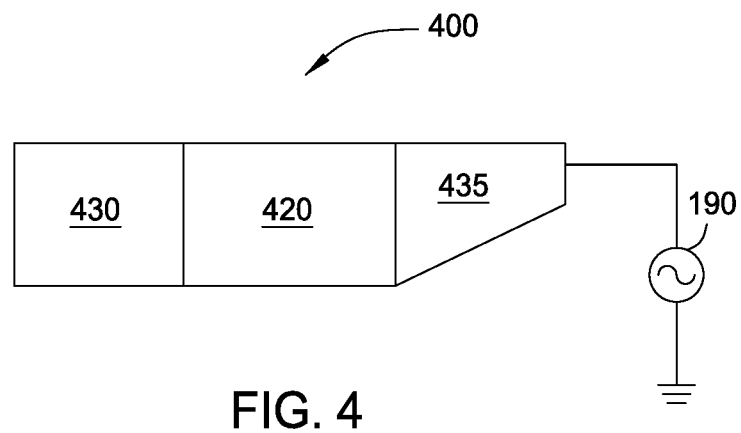
FIG. 4 depicts another embodiment of a bipolar collimator in accordance with one embodiment of the present invention.
Figure 5:
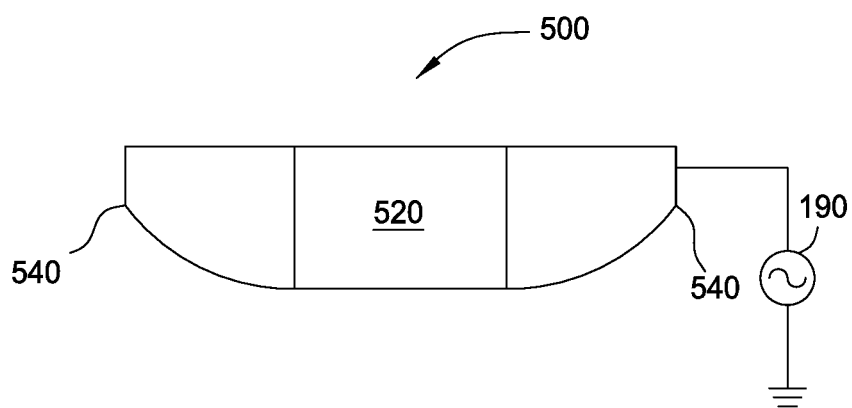
FIG. 5 depicts yet another embodiment of a bipolar collimator in accordance with one embodiment of the present invention.

Referring first to FIGS. 4-5, FIGS. 4-5 depict different embodiments of collimators 400, 500 with different aspect ratio of the hexagonal apertures (e.g., defined as the depth of the hexagonal aperture divided by the width 246 of the aperture) formed in the collimators 400, 500. The collimators 400, 500 include having a plurality of apertures extending therethrough and the apertures located at a center ration having an aspect ratio different from the apertures located at a periphery region of the collimator. In the embodiment of the cross sectional view of the collimator 400 depicted in FIG. 4, the collimator 400 includes a center region 420 and a first peripheral region 430 having a high aspect ratio while includes a second peripheral region 435 having a low aspect ratio. In the embodiment of the cross sectional view of the collimator 500 depicted in FIG. 5, the collimator 500 includes a center region 520 having a high aspect ratio while includes peripheral regions 540 having a low aspect ratio. It is noted that the design and arrangement of the aspect ratio of the hexagonal apertures in the collimator may be changed or varied in any manner as needed to meet different process requirements.

In one embodiment, the collimator power source 190 coupled to the collimator 118 may supply a voltage power to the collimator 118 in a pulsing, or alternating fashion to assist local deposit onto the substrate 101. The Collimator power source 190 is configured to provide negative and/or positive voltage pulses to the collimator 118 so as to control the collimator 118 in uni-polar or bipolar mode as needed. In one embodiment, the collimator 118 controlled in bipolar mode may control and trap ions, so as to create different ratio of ions and neutrals passing through the collimator 118. It is believed that positive voltage pulses applied to the collimator 118 may draw electrons in the plasma toward the substrate surface while the negative voltage pulses applied to the collimator 118 may repel electrons in the plasma toward the target. Therefore, by pulsing alternating positive and negative voltage to the collimator 118, directionality of the ions and neutrals passing through therethrough may be efficiently controlled.

Figure 3:
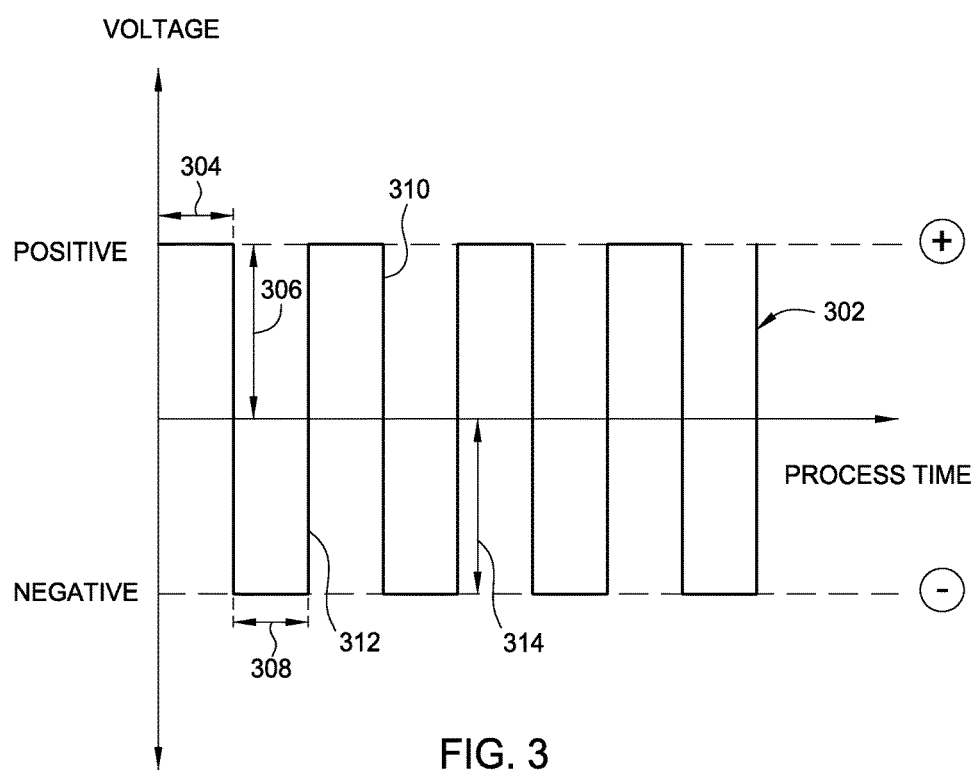
FIG. 3 depicts a voltage applied to the bipolar collimator of FIG. 2 plotted as a function of time in accordance with one embodiment of the present invention.

FIG. 3 depicts a voltage signal 302 detected from the collimator 118 when applying a DC power to the collimator 118. The voltage as supplied from the Collimator power source 190 to the collimator 118 may be controlled in a pulsed mode, as depicted in FIG. 3, to pulse alternating positive voltage 310 and negative voltage 312 to the collimator 118. The positive and negative voltage pulses 310, 312 may have a predetermined pulse width 304, 308 (e.g., pulse time) and pulse magnitude 306, 314 (e.g., pulse voltage value) respectively as needed. The pulse modulation (e.g., pulse width and pulse magnitude) is controlled to effectuate a desired deposition profile. For example, in the embodiment wherein more directional ions are desired to be accelerated toward the substrate surface to enhance bottom-up filling capability, a positive voltage may be supplied with a longer pulse width (e.g., longer pulse time) to assist deposition on the bottom of the trench. In contrast, in the embodiment wherein non-directional ions are desired to deposit on sidewalls of the entrench, or sputter-etch the deposit at the corner of the trench, a negative voltage may be supplied with a longer pulse width (e.g., longer pulse time) to enhance sidewall deposition management. It is noted that the voltage supplied to the collimator 118 may also be in continuous mode as needed.

In one embodiment, the DC bias power pulse from the collimator power source 190 may have a duty cycle between about 5 percent (e.g., 5 percent on and 95 percent off) to about 70 percent (e.g., 70 percent on and 30 percent off), such as between about 5 percent and about 50 percent, such as between about 15 percent to 45 percent, at a bias frequency between about 400 Hz and about 60 MHz. Alternatively, the cycle of the DC bias power pulsed to the collimator 118 may be controlled by a predetermined number of time periods performed. For example, the DC bias power may be pulsed between about every 1 milliseconds and about every 100 milliseconds. It is noted that the duty cycle of the DC bias power pulsed to the collimator 118 may be repeated as many times as needed. In one embodiment, the DC bias power may be controlled at between about 1 KWatts and about 10 KWatts.

Figure 6A:
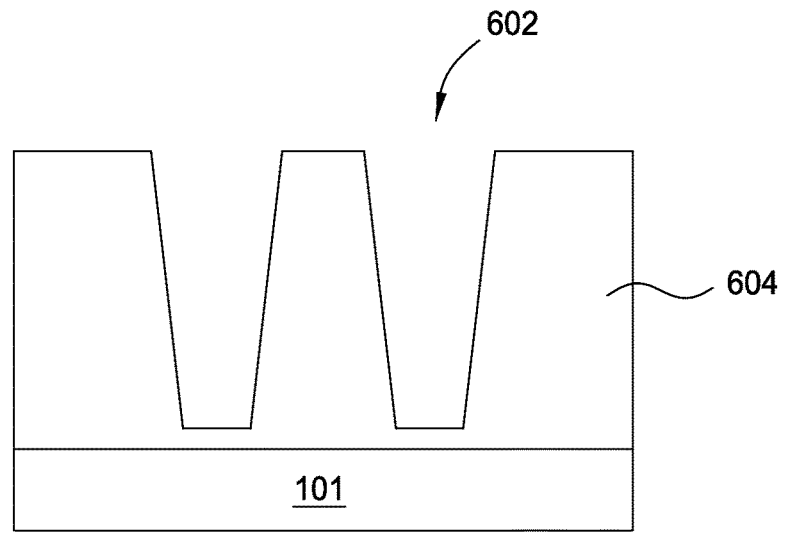
FIG. 6A-6B depicts cross sectional view of a substrate during manufacture of a metal layer deposition process in accordance with one embodiment of the present invention.

In one exemplary embodiment, the material from the sputtering source 114 utilized in the deposition chamber 100 depicted herein is a copper alloy configured to deposit a copper layer into openings 602 formed in an insulating material 604 disposed on the substrate 101, as shown in FIG. 6A. During deposition, a gas mixture is supplied to the deposition chamber 100 to form a copper layer 606 from the sputtered material with high bottom-up filling capability into the openings 602 formed on the substrate 101. In one embodiment, the gas mixture may include reactive gas, non-reactive gas, inert gas, and the like. Examples of reactive and non-reactive gas include, but not limited to, $O_2$, $N_2$, $N_2O$, $NO_2$, $NH_3$, and $H_2O$, among others. Examples of inert gas include, but not limited to, Ar, Ne, He, Xe, and Kr, among others. In one particular embodiment depicted herein, the gas mixture supplied to the process chamber includes at least one nitrogen containing gas and/or an inert gas. The metal alloy target made from a copper containing alloy may be utilized as a source material for the sputtering source 114 for sputter process. It is noted that the copper (Cu) containing target as described here is only for illustration propose and should not be construed as limiting the scope of the invention. Furthermore, the metal alloy target that may be utilized as the sputtering source 114 may be made by a material from a group consisting of Al, Ti, Ta, W, Co, Cr, Ni, alloys thereof, combinations thereof and the like.

After the gas mixture is supplied into the deposition chamber 100 for processing, a high voltage power is supplied to the sputtering source 114, for example the Cu target, to sputter the metal Cu source material from the sputtering source 114 in form of copper ions, such as $Cu^{2+}$. The bias power applied between the sputtering source 114 and the substrate support pedestal 108 maintains a plasma formed from the gas mixture in the deposition chamber 100. The DC bias pulse power supplied to the collimator 118 may assist controlling ion fraction, ratios, and ion trajectory path reaching toward the substrate surface. The ions mainly from the gas mixture in the plasma bombard and sputter off material from the sputtering source 214. The gas mixture and/or other process parameters may be varied during the sputtering deposition process, thereby creating a gradient in the deposited film 606 with desired film properties for different film quality requirements.

In one embodiment, the RF source power may be supplied between about 500 Watts and about 25 KWatts at a frequency between about 400 kHz and about 13.56 MHz. A RF bias power may be applied to the substrate support between about 0 Watts and about 3000 Watts at a frequency between about 13.56 MHz or 2 MHz. In one embodiment, the RF source power may be supplied at the gas mixture between about 100 Watts and about 3000 Watts and at a frequency between about 400 kHz and about 13.56 MHz. The DC bias power may be applied to the collimator between about 1 KWatts and about 4 KWatts in a pulsed mode. It is noted that the DC bias power may be applied to the collimator in a continuous mode as needed.

Several process parameters may also be controlled while supplying the gas mixture and the pulsed RF bias power mode to perform the deposition process. The pressure of the processing chamber may be controlled at between about 0.5 milliTorr and about 500 milliTorr, such as between about 1 milliTorr and about 100 milliTorr, for example about 20 milliTorr. A substrate temperature may be controlled at between about −40 degrees Celsius and about 450 degrees Celsius.

Figure 6B:
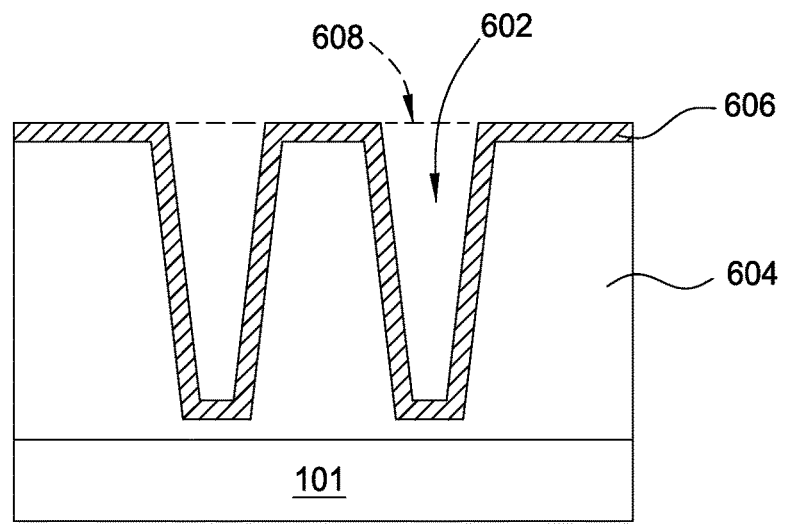

After the deposition process, a metal layer 606, such as a copper layer, may be conformally deposited in the opening 602 with good sidewall and bottom deposition management, as shown in FIG. 6B. It is noted that the deposition process may be continuously performed until the opening 602 defined in the layer of insulating material 604 has been entirely filled with the metal layer 606 showing by the phantom line 608.

Thus, apparatus having a bipolar collimator disposed in a physical vapor deposition chamber and methods of using the same have provided herein. By utilizing a bipolar collimator in a physical vapor deposition chamber, an efficient control of the ion/neutral filtering effect may be obtained so as to efficiently control ion trajectory behavior and assist the bottom-up filling capability during the physical vapor deposition process.

While the foregoing is directed to embodiments of the present invention, other and further embodiments of the invention may be devised without departing from the basic scope thereof, and the scope thereof is determined by the claims that follow.

What is claimed is:

1. An apparatus comprising: a collimator comprising a plurality of apertures extending therethrough, the collimator being bipolar, wherein the collimator has a center region formed between a first peripheral region and a second peripheral region, wherein the first and the second peripheral regions each include an outermost edge periphery of the collimator, wherein the collimator includes a honeycomb structure formed throughout the entire collimator, the honeycomb structure defining the apertures formed in the collimator, wherein the apertures have decreasing heights from the center region to the second peripheral region and portions of aspect ratios of the first peripheral region are the same as portions of aspect ratios of the center region, and the apertures of the first peripheral region have the same height as the apertures of the center region, wherein the first and second peripheral regions and the center region share a top surface parallel to a first bottom surface of the first peripheral region and the center region, with a second bottom surface of the second peripheral region being in a plane that intersects the top surface and the first bottom surface.

2. The apparatus of claim 1 further comprising:
a DC power source coupled to the collimator.

3. The apparatus of claim 1 further comprising:
a polar power supply coupled to the collimator.

4. The apparatus of claim 2, wherein the power source is a bipolar pulsed DC power source.

5. The apparatus of claim 1, wherein the collimator is configured in bipolar mode.

6. The apparatus of claim 1, further comprising:
a chamber body and a chamber lid disposed on the chamber body defining a processing region therein;
a target disposed under the chamber lid.

7. The apparatus of claim 6, wherein the target is fabricated from at least one of Al, Ti, Ta, W, Cr, Ni, Cu, Co, or alloys of Al, Ti, Ta, W, Cr, Ni, Cu, or Co.

8. The apparatus of claim 6, wherein the target is fabricated from copper.

9. The apparatus of claim 6, further comprising:
a first magnet disposed around the chamber body above the collimator.

10. The apparatus of claim 9, further comprising:
a second magnet disposed around the chamber body below the collimator.

11. The apparatus of claim 10, further comprising:
a magnetron assembly disposed above the chamber lid.

12. The apparatus of claim 6, further comprising:
a RF bias power coupled to a substrate support disposed in the processing chamber.

13. An apparatus comprising:
a chamber body and a chamber lid disposed on the chamber body defining a processing region therein;
a target disposed under the chamber lid;
a collimator disposed in the processing region under the lid, the collimator being bipolar, wherein the collimator comprises a plurality of apertures extending therethrough, wherein the collimator has a center region formed between a first peripheral region and a second peripheral region, wherein the first and the second peripheral regions each include an outermost edge periphery of the collimator, wherein the first and the second peripheral region have different heights of the apertures formed therein, wherein the collimator includes a honeycomb structure formed throughout the entire collimator, the honeycomb structure defining the apertures formed in the collimator, the apertures having decreasing heights from the center region to the second peripheral region, wherein portions of aspect ratios of the first peripheral region are the same as portions of aspect ratios of the center region, and the apertures of the first peripheral region have the same height as the apertures of the center region, wherein the first and second peripheral regions and the center region share a top surface parallel to a first bottom surface of the first peripheral region and the center region, with a second bottom surface of the second peripheral region being in a plane that intersects the top surface and the first bottom surface; and
a DC power source coupled to the collimator.

14. The apparatus of claim 13, wherein the DC power source is a bipolar pulsed DC power source.

15. The apparatus of claim 13, wherein the target is fabricated from at least one of Al, Ti, Ta, W, Cr, Ni, Cu, Co, or alloys of Al, Ti, Ta, W, Cr, Ni, Cu, or Co.

16. The apparatus of claim 13, wherein the target is fabricated from copper.

17. A process kit, comprising:
a collimator, the collimator being bipolar, wherein the collimator comprises a plurality of apertures extending therethrough, wherein the collimator has a center region formed between a first peripheral region and a second peripheral region, wherein the first and the second peripheral regions each include an outermost edge periphery of the collimator, wherein the first peripheral region and the second peripheral region have different heights of the apertures formed therein, wherein the collimator includes a honeycomb structure formed throughout the entire collimator, the honeycomb structure defining the apertures formed in the collimator, the apertures having decreasing heights from the center region to the second peripheral region, and portions of aspect ratios of the first peripheral region are the same as portions of aspect ratios of the center region, and the apertures of the first peripheral region have the same height as the apertures of the center region, wherein the first and second peripheral regions and the center region share a top surface parallel to a first bottom surface of the first peripheral region and the center region, with a second bottom surface of the second peripheral region being in a plane that intersects the top surface and the first bottom surface.

\* \* \* \* \*